(12) United States Patent
Dhanapal et al.

(10) Patent No.: US 8,189,618 B2
(45) Date of Patent: May 29, 2012

(54) SYSTEM AND METHOD FOR ROBUST DATA LOSS RECOVERY IN A WIRELESS LOCAL AREA NETWORK

(75) Inventors: Karthikeyan Balaji Dhanapal, Tamif Nadu (IN); Kartik Muralidharan, Karnataka (IN); Puneet Gupta, Karnataka (IN)

(73) Assignee: Infosys Technologies Limited (IN)

( * ) Notice: Subject to any disclaimer, the term of this patent is extended or adjusted under 35 U.S.C. 154(b) by 337 days.

(21) Appl. No.: 12/386,673

(22) Filed: Apr. 21, 2009

(65) Prior Publication Data

US 2010/0111054 A1 May 6, 2010

(30) Foreign Application Priority Data

Apr. 21, 2008 (IN) .............................. 969/CHE/2008

(51) Int. Cl.
*H04J 3/24* (2006.01)
(52) U.S. Cl. .......................... 370/473; 370/474; 370/312
(58) Field of Classification Search .................. 370/312, 370/349, 310.2, 328, 338, 471, 473, 474, 370/432, 444
See application file for complete search history.

(56) References Cited

U.S. PATENT DOCUMENTS

| | | | |
|---|---|---|---|
| 7,292,088 B2* | 11/2007 | Jeong | 327/437 |
| 7,310,325 B2* | 12/2007 | Maeno | 370/338 |
| 7,808,963 B2* | 10/2010 | Gupta et al. | 370/342 |
| 2007/0160026 A1* | 7/2007 | Gupta et al. | 370/342 |
| 2009/0161595 A1* | 6/2009 | McNew et al. | 370/312 |
| 2010/0085922 A1* | 4/2010 | Dhanapal et al. | 370/329 |
| 2010/0105409 A1* | 4/2010 | Agarwal et al. | 455/456.1 |

* cited by examiner

*Primary Examiner* — Brenda H Pham
(74) *Attorney, Agent, or Firm* — Lerner, David, Littenberg, Krumholz & Mentlik, LLP

(57) ABSTRACT

A system and method for robust data loss recovery in a wireless local area network is provided. The method includes splitting user data into multiple data fragments. The method further includes creating multiple beacon frames by placing each data fragment in a unique beacon frame and broadcasting the beacon frames through a wireless medium by an access point of the network. Prior to transmission, the method includes arranging the frames into a plurality of groups and creating a parity frame for each group, to be transmitted along with the beacon frame. After transmission, the beacon frames are received by a wireless client and data fragments are extracted from each beacon frame. At the receiving end, the wireless client checks whether all the transmitted beacon frames have been received. Finally, the user data is reconstructed from the extracted data fragments by reassembling the data fragments.

12 Claims, 7 Drawing Sheets

SYSTEM AND METHOD FOR ROBUST DATA LOSS RECOVERY IN A WIRELESS LOCAL AREA NETWORK

FIELD OF INVENTION

The present invention relates to system and method for robust data loss recovery in a wireless local area network and more specifically to provide forward error correction and intelligent data sequencing for recovering data packets and improving overall end user experience.

BACKGROUND OF THE INVENTION

Technological advancements have made wireless communications devices inexpensive and accordingly ubiquitous. With increase in mobile computing devices such as laptops, tablets, personal digital assistants, etc. there has been a continuous demand to connect them wirelessly and efficiently. A Wireless Local Area Network (WLAN) is a computer network that implements the connection of multiple wireless devices.

Wireless devices connect to a wireless access point in order to gain access to a wireless network. The most commonly used wireless network standard is IEEE 802.11. Most of the computing devices used nowadays have built-in wireless capability i.e. the computing devices are capable of connecting to a wireless network. Examples of such computing devices may include mobile devices, such as personal digital assistants, smartphones, music players, media centers and the like. A computing device attempting to transfer data in a wireless network present in its vicinity needs to establish a connection with the network. A preliminary step in establishing connection includes the access point identifying itself by transmitting a service set identifier (SSID) in a broadcast packet. The broadcast packet is received by all the wireless devices present in the network. A computing device can complete the connection establishment process by exchanging information with the wireless access point, such as security information, bandwidth information, wireless network id, network name and the like. Completion of connection establishment with the wireless network takes a certain amount of time, which is bandwidth inefficient.

Moreover, if the data transfer required by the mobile computing device is in the form of small data packets, a connection oriented approach necessitates a substantial overhead in the form of time delay due to connection establishment process. Additionally, in the case of multiple computing devices requiring access to a network simultaneously, a connection-oriented approach requires all the computing devices to establish and remain connected with the network, in order to receive data. This causes a reduction in throughput of the data transfer within the network.

Consequently, there is a need for a system and method for providing connectionless data transfer to mobile wireless devices. One of the methods of providing connectionless data transfer is fragmenting user data into individual fragments and transmitting each fragment by embedding it in the SSID field of a beacon frame. At the receiver, the fragments are extracted from the beacon frames and are reassembled to obtain the user data.

In a connectionless data transfer, a transmitted frame might be lost either due to data corruption or if the sender and receiver are not in sync with each other. As a result, the client might require more than one broadcast cycle to receive all the fragmented frames, which might result in a decrease in throughput. Thus, there is a need for a system and method to provide for a robust data loss recovery in a wireless network employing connectionless data transfer.

SUMMARY OF THE INVENTION

A method and system for improving bandwidth of a local area network is provided. In an embodiment of the present invention, the bandwidth of the local area network is improved by increasing the throughput of data transfer in the network.

In various embodiments of the present invention, the method includes splitting user data into multiple data fragments. Further, the method includes creating multiple beacon frames by placing each data fragment in a unique beacon frame. Further, the method includes broadcasting the beacon frames through a wireless medium by an access point of the network.

In an embodiment of the present invention, the beacon frames are received by a wireless client. Thereafter, the wireless client extracts data fragments from each beacon frame and reconstructs the user data from the extracted data fragments by reassembling the data fragments.

In another embodiment of the present invention, the method for increasing the throughput of data transfer in the network includes creating multiple beacon frames by inserting a data fragment in SSID field of the beacon frame and inserting header information in the SSID field to create the beacon frame. Further, each beacon frame is broadcasted by using a distinct BSSID for each individual frame.

In another embodiment of the present invention, upon receipt of a beacon frame by the wireless client, the beacon frame is relayed by a NIC of the wireless client to MAC layer for processing.

In yet another embodiment of the present invention, the system for increasing the throughput of data transfer in the network includes a broadcast server configured to broadcast user data though a wireless medium. Further, the broadcast server comprises a server application configured to fragment user data into multiple data fragments and inserting the data fragments into multiple beacon frames.

In yet another embodiment of the present invention, the system includes a throughput scaling module configured to assign a distinct BSSID to each beacon frame for transmission. Further, the system includes a wireless client configured to receive data broadcasted by the broadcast server.

In yet another embodiment of the present invention, the wireless client of the system includes a WLAN hardware interface configured to drive the one or more beacon frames to MAC layer for further processing. Further, the wireless client includes a data reassemble module configured to extract the one or more data fragments from the one or more beacon frames and to reassemble user data from the one or more data fragments. The wireless client in conclusion utilizes the user data to perform a software task.

In yet another embodiment of the present invention, broadcasting the beacon frames includes arranging the frames into multiple groups and computing a parity code for each group. Further, the beacon frames are transmitted sequentially whilst interspersed with parity frames.

In yet another embodiment of the present invention, upon receiving beacon frames, a check is performed to determine whether the beacon frames have been received. In the event of the non-receipt of the beacon frames, an exclusive OR operation of frames belonging to a particular group with the parity frame of the group is performed in order to recover the lost frame.

BRIEF DESCRIPTION OF THE ACCOMPANYING DRAWINGS

The present invention is described by way of embodiments illustrated in the accompanying drawings wherein.

DETAILED DESCRIPTION OF THE INVENTION

A system and method for robust data loss recovery in a wireless local area network are described herein. The invention provides forward error correction codes using parity codes and data sequencing method to transmit data for achieving higher throughput. In various embodiments of the present invention, the fragments to be transmitted are grouped into multiple groups and a parity code is generated for each group.

The following disclosure is provided in order to enable a person having ordinary skill in the art to practice the invention. Exemplary embodiments are provided only for illustrative purposes and various modifications will be readily apparent to persons skilled in the art. The general principles defined herein may be applied to other embodiments and applications without departing from the spirit and scope of the invention. Also, the terminology and phraseology used is for the purpose of describing exemplary embodiments and should not be considered limiting. Thus, the present invention is to be accorded the widest scope encompassing numerous alternatives, modifications and equivalents consistent with the principles and features disclosed. For purpose of clarity, details relating to technical material that is known in the technical fields related to the invention have not been described in detail so as not to unnecessarily obscure the present invention.

The present invention would now be discussed in context of embodiments as illustrated in the accompanying drawings.

Figure 1:
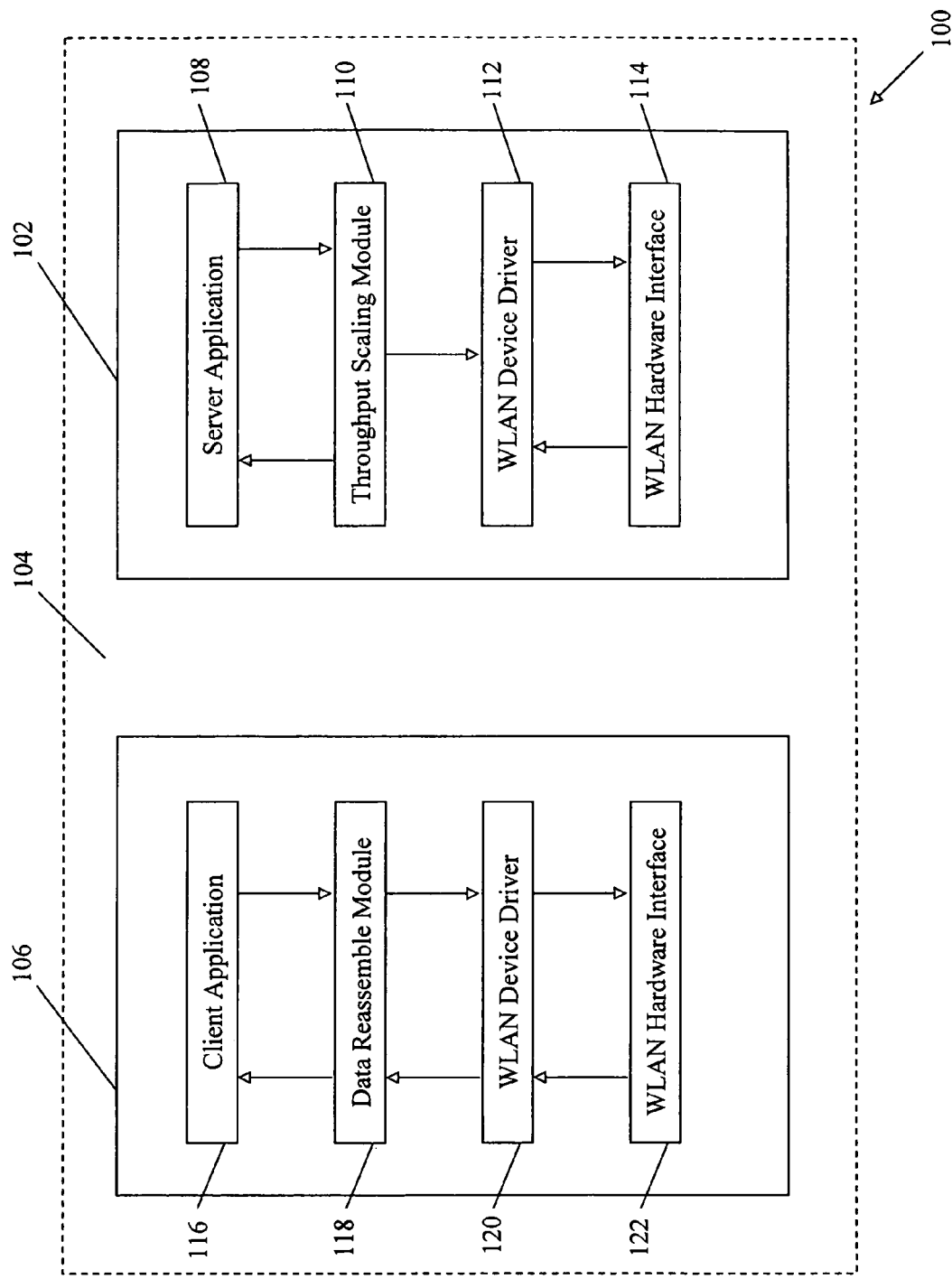
FIG. 1 is a block diagram illustrating the components of a Wireless Local Area Network operating in accordance with the present invention.

FIG. 1 illustrates a block diagram illustrating the components of a Wireless Local Area Network 100 operating in accordance with the present invention. The wireless network 100 comprises a broadcast server 102, a wireless medium 104 and a wireless client 106. An example of a broadcast server may be a wireless access point of a wireless local area network. Examples of wireless clients include, but are not limited to, mobile computing devices such as personal digital assistants, smartphones, music players, media centers and the like. In an embodiment of the present invention, the broadcast server 102 further comprises a server application 108, a throughput scaling module 110, WLAN device driver 112, and a WLAN hardware interface 114. The wireless client 106 further comprises a client application 116, a data reassemble module (DRM) 118, WLAN device driver 120, and a WLAN hardware interface 122.

The broadcast server 102 broadcasts data over the wireless medium 104. In an embodiment of the present invention, the data broadcasted by the broadcast server 102 is received by wireless clients within transmission range of the broadcast server 102. In an embodiment of the present invention, the wireless client 106 is a mobile computing device requiring the information and use of capabilities of infrastructure in its surroundings. An example of the wireless client 106 includes a mobile computing device used by a user wanting to send email using a wireless connection within the premises of an airport, while waiting for his connecting flight. In an embodiment of the present invention, in order to use a wireless connection for sending email, the wireless client receives data broadcasted by the broadcast server 102 without establishing a connection with the wireless network 100. Broadcasting data includes transmitting a broadcast packet to wireless devices within range of the broadcast server in the network 100. In various embodiments of the present invention, data to be transmitted by a wireless LAN is broken down into smaller data units i.e. data frames and embedded in multiple beacon frames before transmitting it through the wireless medium 104. Beacon frames are part of the IEEE 802.11 wireless network protocol having control information and are transmitted periodically by wireless access points to enable nearby wireless clients to identify and associate with wireless LAN's. Beacon frames generally include information regarding WLAN service area, access point address, time stamps and supported data transfer rates. Additionally, beacon frames also contain information about transmitter's capability, network id, network name etc. which the receiver may use for connection establishment. One of the fields included in a beacon frame is the SSID field used for identifying a specific wireless LAN.

In various embodiments of the present invention, each frame which is to be transmitted is inserted into the SSID field of a beacon frame. The SSID field is a user defined namespace and may be programmed as per requirements. By embedding information in the SSID field, a seamless and connectionless short data stream between the broadcast server 102 and the wireless client 106 may be established.

The wireless client 106 is a computing device capable of wireless communication. The wireless client 106 acts as a receiver and accepts data broadcasted by the broadcast server 102 over the wireless medium 104. In an example, the wireless client 106 scans each available frequency channel for a specified period of time in order to discover existing WLAN networks in its vicinity. In another example, the wireless client 106 sends probe requests for discovering the networks. The wireless client 106 receives beacon frames from all broadcast servers within range, advertising their SSID. In various embodiments of the present invention, when a beacon frame is received by a Network Interface Card (NIC) of the wireless client 106, the SSID field is processed. The wireless client 106 reassembles data frames obtained from the SSID field of each beacon frame in order to obtain the data broadcasted by the broadcast server 102.

The server application 108 comprises two functional modules. The first functional module of the server application 108 fragments user data to be transmitted by the broadcast server 102 into small data packets (frames). In various embodiments of the present invention, a frame comprises header data and payload i.e. user data. In an embodiment of the present invention, the user data may be data required by the wireless client 106 in order to use the infrastructure capabilities available in its vicinity. For example, in case of internet access application, the user data may include HTML and XML files for rendering display of web pages on the wireless client 106. In another example, the user data may include files described in other markup languages, such as, XML, SGML and the like. After fragmenting the user data into frames, the first functional module appends header information to each frame. The header information contains fragment number and file size. The fragment number indicates the ordered position of the fragment in the data reassembled at the client side by collocating the frames received by the wireless client 106. Additionally, the header information includes source address and checksum characters for error detection and correction. The second functional module of the server application 108 includes a scheduler which schedules transmission of header appended frames to the WLAN device driver 112 in a predetermined order from where they are broadcasted as part of beacon frames.

By default, one of the fields in a beacon frame sent by the broadcast server 102 is Basic Service Set Identifier (BSSID). A BSSID field in a beacon frame identifies the Medium Access Control (MAC) address of access point of a wireless LAN. In an embodiment of the present invention, the BSSID field identifies the MAC address of the broadcast server 102. Standard implementations of NIC of wireless devices used in the industry only push beacon frames with unique BSSIDs to the MAC layer for further processing. The throughput scaling module 110 provides means for broadcasting beacon frames including user data with distinct BSSIDs so that all beacon frames sent by the broadcast server 102 are relayed by a NIC of the wireless client 106 to the MAC layer for further processing. The WLAN device driver 112 is a software program that enables communication of the server application 108 with the NIC for appropriate implementation of the 802.11 protocol in transmitting and receiving data frames. The WLAN hardware interface 114, an 802.11 compliant hardware device also known as the Network Interface card (NIC). The WLAN hardware interface 114 is a physical and data link layer device that provides the broadcast server 102 with physical access to the wireless medium 104, for transmitting data and also implements the management of MAC addresses.

The client application 116 is a software application that uses data transmitted by the broadcast server 102 in order to process a software task. In an embodiment of the present invention, the client application 116 may provide a graphical user interface or character user interface, depending upon the kind of device, to view data received from the broadcast server 102. The client application 116 belongs to the application layer of the Open Systems Interconnection (OSI) reference model and directly interacts with the user of a device running the application. The client application 116 receives assembled data packets from the Data Reassemble Module 118, which is responsible for reconstructing data from the frames sent by the broadcast server through the wireless medium 104. In an embodiment of the present invention, the DRM 118 uses the header information (i.e. the fragment number and the file size) in order to reassemble the frames. The WLAN device driver 120 is a software program that enables communication of the client application 116 with a NIC of the wireless client 106. In an embodiment of the present invention, the WLAN Hardware Interface 122 is the NIC that communicates with the wireless medium 104 through microwaves. The WLAN device driver 120 issues commands to the WLAN Hardware interface to enter into scanning stage and capture data. The WLAN device driver 120 also controls the 802.11 protocol implementation with respect to capturing data through the wireless medium 104.

Figure 2:
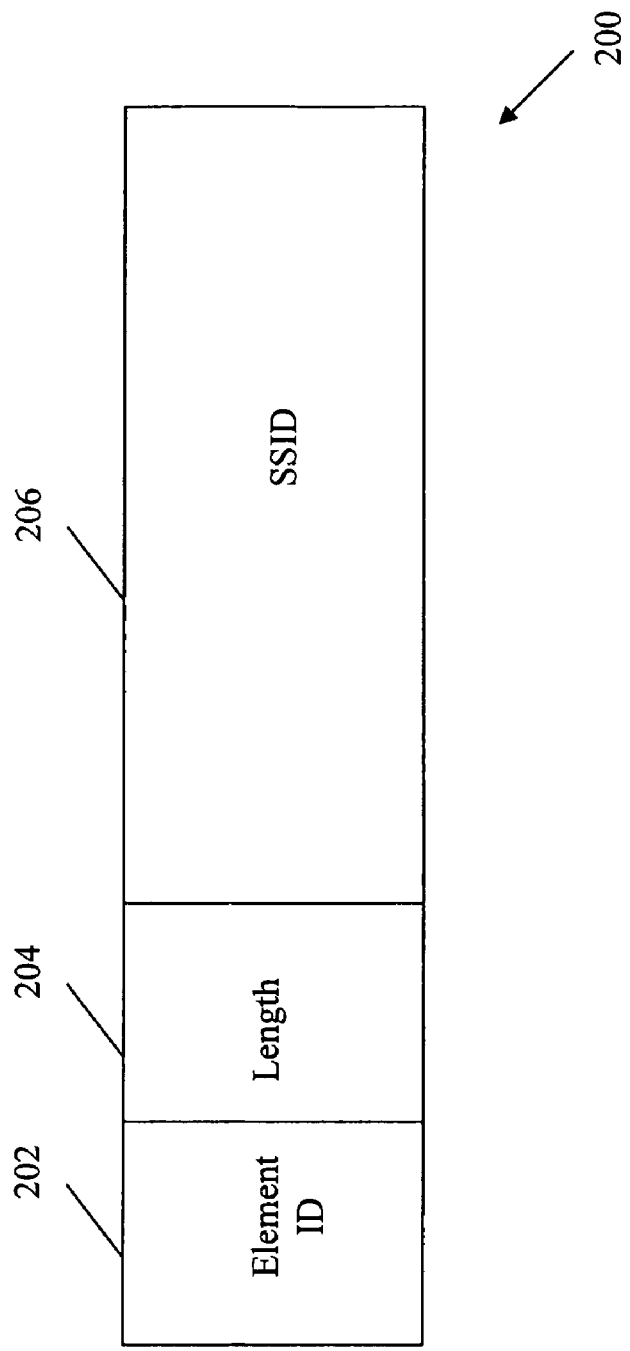
FIG. 2 illustrates a single beacon frame having a 32-byte SSID field.

FIG. 2 depicts a single beacon frame having a 32 byte SSID field. The SSID field is used for identifying a specific wireless LAN. The beacon frame 200 comprises an element id 202, a length field 204, and an SSID field 206. As stated in the description of FIG. 1, data to be transmitted by the broadcast server 102 is embedded in the SSID field of a beacon frame in order to improve the throughput of data transmission. In various embodiments of the present invention, the data transferred from the broadcast server 102 (FIG. 1) to the wireless client 106 (FIG. 1) is greater than 32 bytes, therefore, a fragmentation and reassembling mechanism is employed where the data is distributed over multiple beacon frames. The fragmented structure used for embedding and transmitting data using SSID fields is described in conjunction with the description of FIG. 3.

Figure 3:
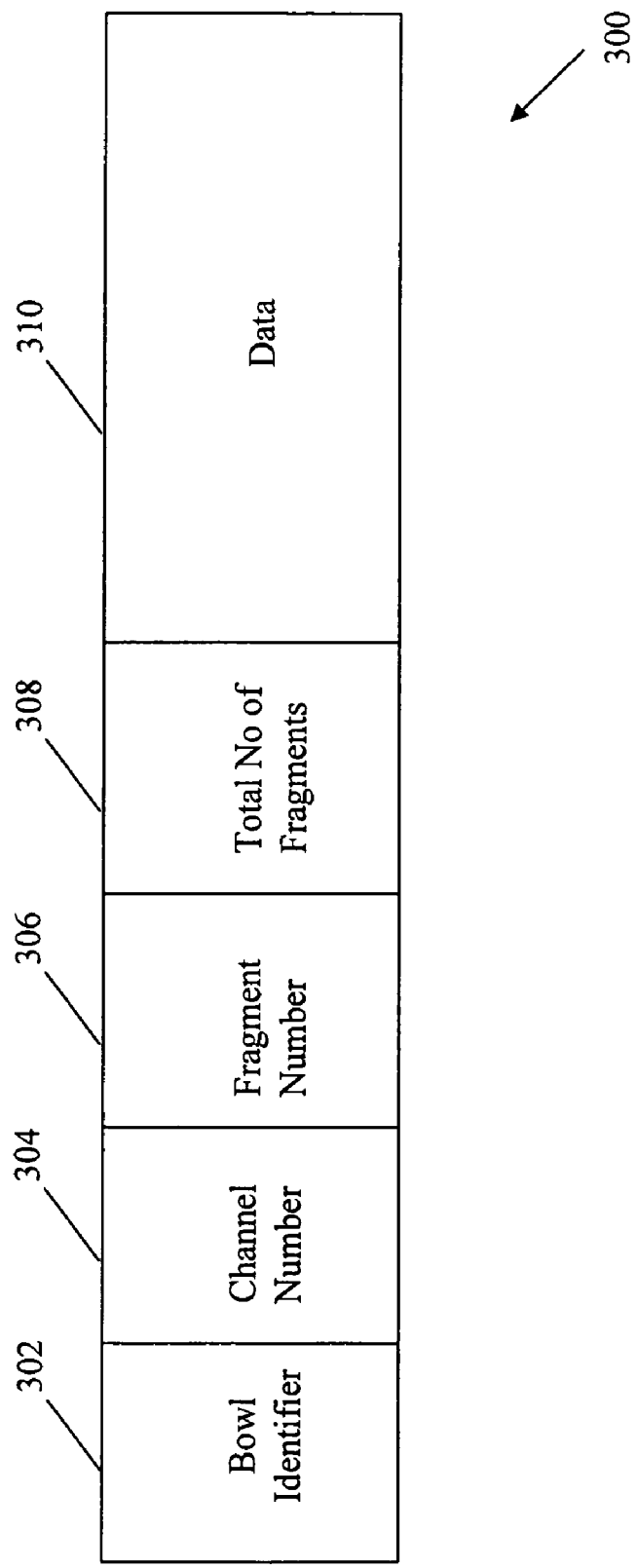
FIG. 3 illustrates structure of the SSID field of a beacon frame containing fragmented data in accordance with the present invention.

FIG. 3 illustrates a structure of the SSID field of a beacon frame containing fragmented data in accordance with the present invention. In various embodiments of the present invention, user data to be transmitted is divided into small data chunks known as fragments, where each fragment is placed in the SSID field of a distinct beacon frame before transmitting the beacon frame. Thus, multiple beacon frames containing the fragments are transmitted which are received at the client side. Each individual fragment is tagged with a fragment number indicating its ordered position within the user data. At the client side, the individual fragments are extracted from the SSID field of each beacon frame and the fragments are then reassembled to obtain the user data. The structure of the SSID field of a beacon frame containing a data fragment comprises the following fields: BOWL (Broadcast over Wireless LAN) identifier 302, channel number 304, fragment number 306, total number of fragments 308, and user data 310. The BOWL identifier 302 is a 1-byte field (octet) that provides a unique identifier (number) for identifying that the beacon frame is a frame containing a data fragment in accordance with the present invention. The channel number 304 is an octet that specifies the frequency channel used for broadcasting the beacon frame. The 802.11 wireless LAN standard specifies the use of multiple frequency channels for data transmission. In various embodiments of the present invention, up to 14 frequency channels can be used for data transmission. The fragment number 306 is an octet that indicates the fragment in terms of its ordered position in the user data. For example, if user data is fragmented using three broadcast frames, the first broadcast frame would have its fragment id set to '1', the second broadcast frame would have its fragment id set to '2', and the third broadcast frame would have its fragment id set to '3'. At the client side, individual fragments from each beacon frame are extracted and the fragments are reassembled using the fragment numbers to construct the user data. Total number of fragments 308 is a field that stores a count of total number of fragments in user data and are used to match with the number of fragments received at the client side for constructing the user data. In an embodiment of the present invention, if the total number of fragments received is not equal to the total number of fragments then an error correction mechanism is employed. The data 310 is the fragmented stored in the remaining 26 bytes and forms the effective payload out of 32 bytes in a SSID field structure. In various embodiments of the present invention, each channel broadcasts data for a different purpose in a periodic broadcast cycle. A broadcast cycle is considered complete when all data fragments of each channel have been broadcasted once. The periodic repetition of fragments over successive cycles allows asynchronous operation between broadcast server 102 (FIG. 1) and the wireless client 106 (FIG. 1) thus enabling more reliable transmission, even when the beacon frames are not acknowledged explicitly. In an embodiment of the present invention, channels may be added or deleted only after completion of at least one broadcast cycle.

Figure 4:
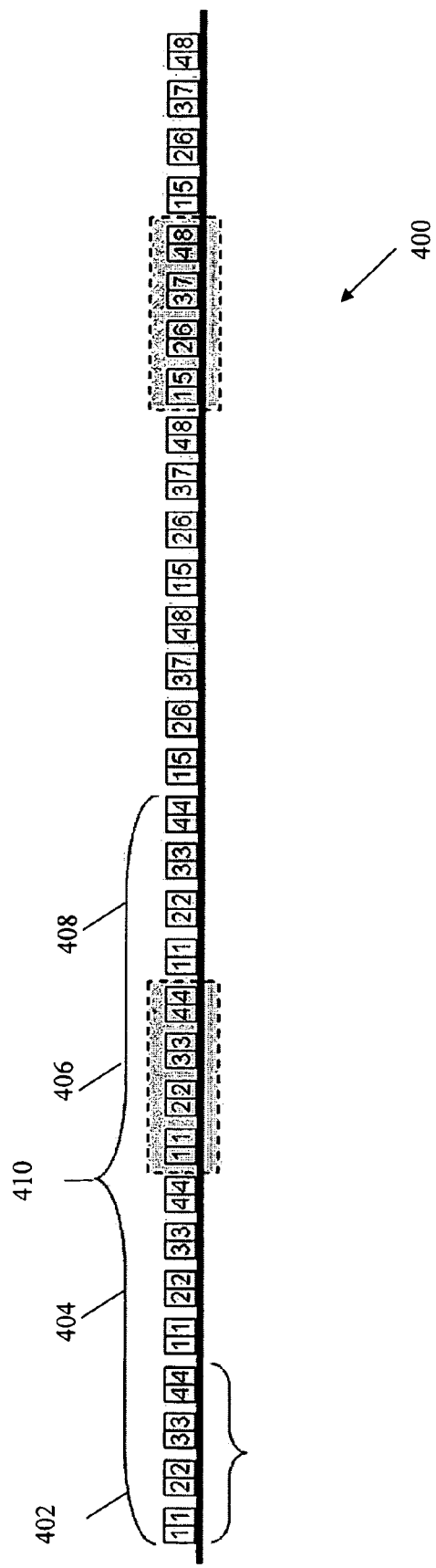
FIG. 4 illustrates an exemplary technique of sequencing beacon frames using multiple BSSID's for improving throughput of the network.

FIG. 4 illustrates an exemplary technique of sequencing beacon frames using multiple BSSID's for improving throughput of the network. In various embodiments of the present invention, the wireless client 106 (FIG. 1) initiates periodic scans to access wireless LANs in its vicinity. According to the IEEE 802.11 wireless standard, 14 different frequency channels are available to the broadcast server 102 (FIG. 1) for broadcasting data. During the scanning process, the wireless client 106 spends a predetermined time in each frequency band (known as dwell time) and captures beacon frames transmitted at that frequency. Standard implementations of NIC of wireless devices used in the industry only pushes beacon frames with unique BSSIDs to the MAC layer for further processing. Hence, during dwell time in a particular frequency band, only beacon frames with distinct BSSID's are processed. In an embodiment of the present invention, multiple beacon frames with distinct data fragments corresponding to the same user data are transmitted with unique BSSID's so that the beacon frames are processed by the wireless client to acquire the user data. Throughput of the system of the present invention is increased by employing different BSSIDs for successive beacon frames, even though the beacon frames are transmitted by the broadcast server 102 (FIG. 1). Since the number of distinct BSSIDs used controls the number of beacons reported, the throughput of the system scales proportionately. From the perspective of the wireless client 106, the beacon frames with distinct BSSIDs are interpreted as frames transmitted by distinct servers. In various embodiments of the present invention, the wireless client 106 stores the SSID field from each beacon frame as if they are from multiple servers which the application may retrieve as and when required. For example, when 16 BSSIDs are used, broadcast server 102 may use the corresponding 16 SSID fields to transmit user data which in turn scales up the bandwidth by 16 times. Depending on bandwidth requirements, variable number of BSSIDs may be used to match bandwidth requirement.

The sequence 410 indicates the series of beacon frames transmitted by the broadcast server 102 in four different frequency channels F1, F2, F3 and F4. The first set 402 of the sequence 410 are the beacon frames captured by the wireless client during its dwell time at F1 frequency. As shown in the figure, the beacon frames captured at F1 frequency are sent with the BSSIDs 1, 2, 3 and 4. The second set 404 denotes the frames which have been sent at F2 frequency. The third set 406 denotes those frames which have been captured while they were transmitted in F3 frequency. The fourth set 408 denotes those frames which have been missed out while they were transmitted in F4 frequency. All the set of frames when combined together form a fragment fresh interval 410 which represents the duration after which the set of beacon frames are refreshed.

In various embodiments of the present invention, the maximum number of beacons pushed to wireless client 106 per scan time equals the number of beacons with different BSSIDs i.e. B frames per Tscan time interval. Thus the maximum effective throughput that may be achieved is $(B*p*8)/(1000*Tscan)$ kbps where p is payload per beacon frame.

Figure 5:
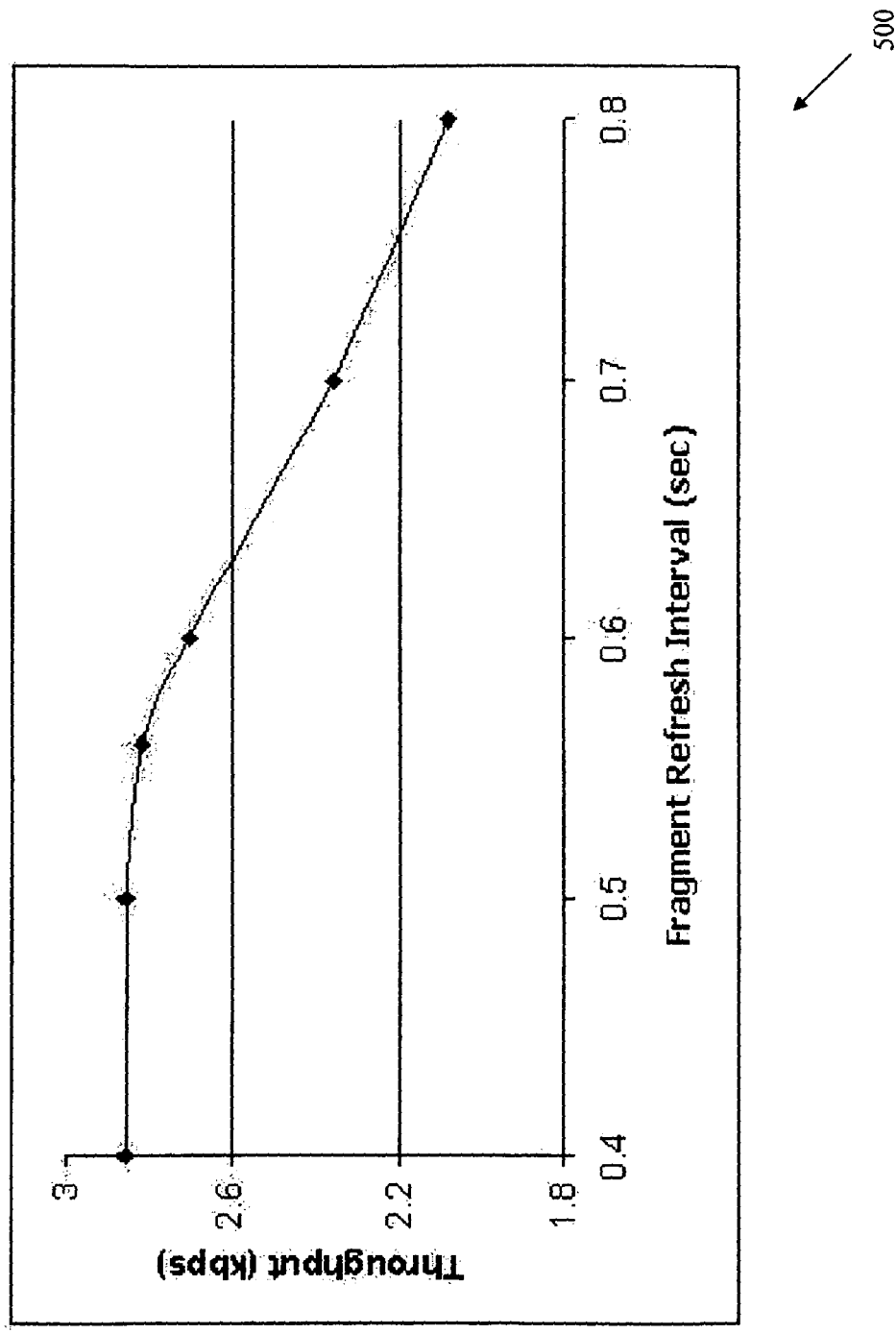
FIG. 5 illustrates a graph of throughput versus fragment refresh interval.

FIG. 5 illustrates a graph of throughput versus fragment refresh interval. From the graph, it is observed that throughput is also affected by fragment refresh interval, in addition to the scan time. A faster fragment refresh interval within a predetermined scan time results in higher throughput, since more number of beacon frames are captured within the subsequent intervals in the same scan time. The fragment refresh interval is represented in seconds and throughput is represented in kilo bits per seconds (kbps). The dependence of the fragment refresh interval on the effective throughput is expressed as below:

$$\text{Throughput}=B*p*8/\max(T\text{scan};T\text{frag})\text{bps}$$

Where B is the number of beacon frames with different BSSID's used, p is payload per beacon frame, Tscan is the scan time, and Tfrag is fragment refresh rate.

Figure 6:
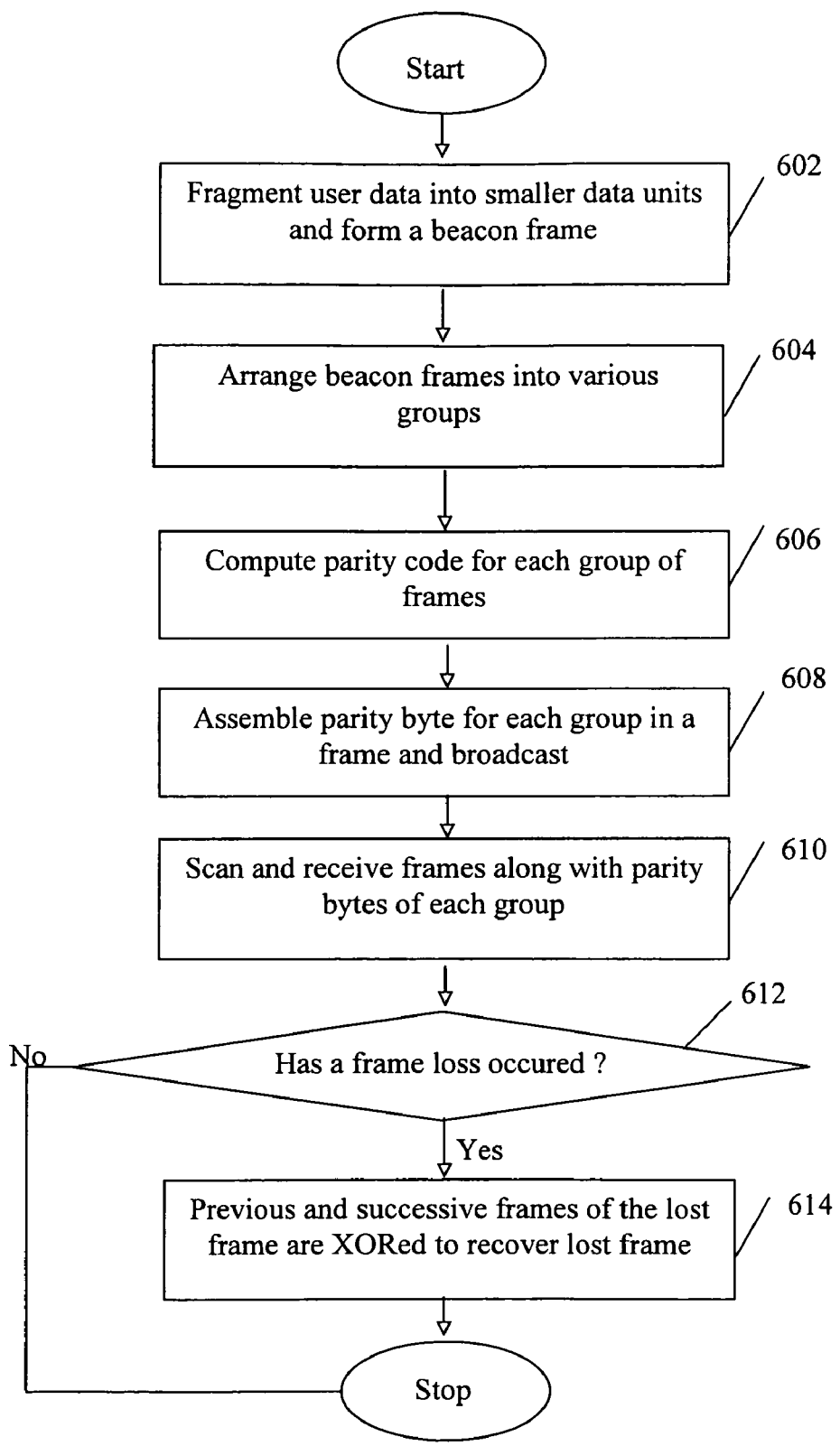
FIG. 6 illustrates a method of robust frame loss recovery mechanism of the present invention.

FIG. 6 illustrates a method of robust frame loss recovery mechanism of the present invention. At step 602, user data is broken down into smaller data units (fragments). In an embodiment of the present invention, each fragment is embedded in the SSID field of a beacon frame and is assigned a unique BSSID. At step 604, the beacon frames are arranged into various groups. In an embodiment of the present invention, for n number of beacon frames, the total number of groups may be n/s and each group ($G_i$) contains s number of frames (Fs), where $1 \leq i \leq [n/s]$. In another embodiment of the present invention, the total number of groups are k where each group ($G_i$) contains s frames except the group $G_k$ which may contain less than s frames. In an exemplary embodiment, a user data file is broken into n beacon frames which are denoted by $F_1, F_2, \ldots, F_n$ and are further grouped into k groups as follows:

$$G_1 = \{F_1, F_2, \ldots, F_s\}$$
$$G_2 = \{F_{s+1}, F_{s+2}, \ldots, F_{2s}\}$$
$$G_2 = \{F_{2s+1}, F_{2s+2}, \ldots, F_{3s}\}$$
$$\vdots$$
$$G_k = \{F_{(k-1)s+1}, F_{(k-1)s+2}, \ldots, F_n\}$$

At step 606, a parity code is computed for each group of frames. In an embodiment of the present invention, a parity code is calculated for each group of frames. The parity code for each group is calculated by performing an exclusive OR (XOR) operation on corresponding bytes of each frame ($F_i$) in a group to obtain the corresponding byte of parity. For example, let the parity code for $G_1$ be represented by $PB_1$. Consequently, parity for the first byte of the parity code is calculated as:

$$PB_1(1)=F_1(1)^\wedge F_2(1)\ldots{}^\wedge F_s \quad (1)$$

where $PB_1(1)$ is parity code for first byte calculated by exclusive OR (XOR) of first byte of all frames in group $G_1$ and s is the number of frames in each group.

Similarly, parity for the second byte of the parity code is calculated as:

$$PB_1(2)=F_1(2)^\wedge F_2(2)\ldots{}^\wedge F_s \quad (2)$$

Thus, parity for all bytes of the parity code are calculated for group $G_1$. Subsequently, parity codes for all groups are calculated, where $PB_i$ denotes parity code for the $i^{th}$ group, and $PB_i(j)$ denotes parity for $j^{th}$ byte of the parity code $PB_i$.

At step 608, parity bytes for each group are assembled into a parity frame and are broadcasted over the wireless network by the broadcast server. In an embodiment of the present invention, the transmission of parity frames is interspersed between the transmission of beacon frames, such that, in case of a loss of multiple beacon frames from a transmission sequence, the frames can be recovered using remaining frames and parity frames. In an exemplary embodiment having 12 fragments, 3 groups with 4 fragments each, G1=F1; F2; F3; F4; G2=F5; F6; F7; F8; G3=F9; F10; F11; F12, three parity fragments are generated, such as G3=F9; F10; F11; F12, three parity fragments are generated i.e. PB1, PB2 and PB3. In this embodiment, the transmission sequence is F1, F5, F9, F2, PB1, F6, F10, F3, F7, PB2, F11, F4, F8, F12, PB3. This sequence ensures that that if multiple frames from the transmission sequence are lost, they can still be recovered from the remaining frames. For example, if F6 and F10 are lost, they can be recovered by XORing F5, F7, F8, PB2 and F9, F11, F12, PB3 respectively.

At step 610, the wireless client scans and receives frames along with the parity bytes of each group. At step 612, a check is performed whether the client has received all the frames. If all the frames have not been received then at step 614, frames belonging to the same group as that of the lost frame are XORed with the parity frame of the group to recover the lost frame. In an exemplary embodiment, if a single frame $F_2$ is lost in a group then the lost frame can be recovered as follows:

$$F_2(1) = F_1(1) \wedge PB_1(1) \wedge F_3(1) \ldots \wedge F_s(1)$$
$$F_2(2) = F_1(2) \wedge PB_1(2) \wedge F_3(2) \ldots \wedge F_s(2)$$
$$\vdots$$
$$F_2(m) = F_1(m) \wedge PB_1(m) \wedge F_3(m) \ldots \wedge F_s(m)$$

Figure 7:
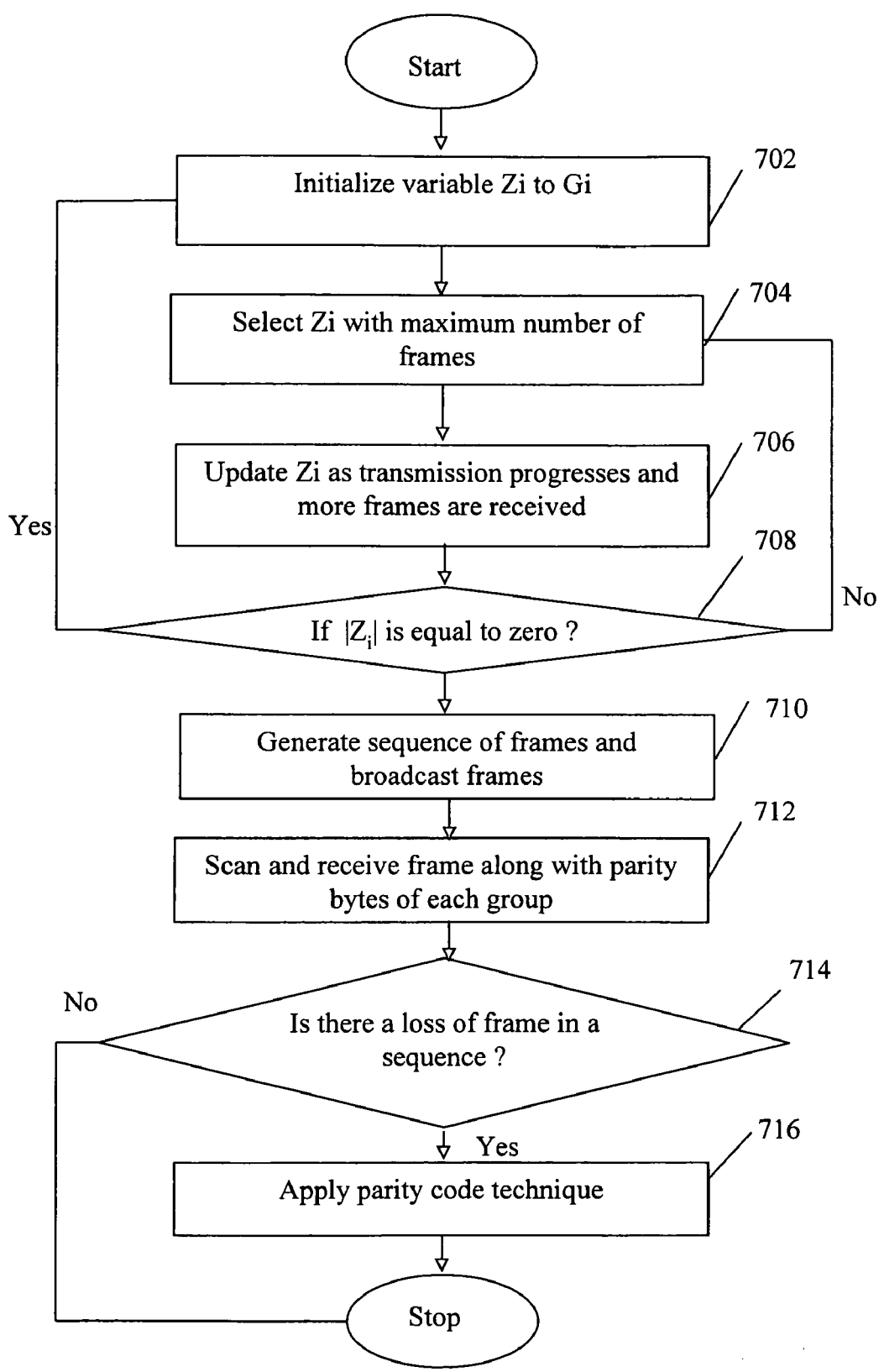
FIG. 7 illustrates a method of robust frame loss recovery mechanism for multiple frames.

FIG. 7 illustrates a method of robust frame loss recovery mechanism for multiple frames. At step 702, Zi is initialized to Gi for all, where G represents the frame group and where i represents ith frame. In an embodiment, Zi is a mathematical variable which is assigned the sum total of all frames in a group. In an exemplary embodiment, if Group ($G_2$) is having 8 frames then the value of $Z_2$ is 8.

At step 704, Zi with maximum number of frames is selected. In an embodiment of the present invention, $|Z_i| >= Z_j|$ for all j in {1, 2, . . . k} where $|Z_i|$ represents the number of frame in $Z_i$ at given point of time. In various embodiments, if there are more than one group having equal number of frames then the group which comes first in the sequence is selected.

At step 706, Zi is updated as the transmission progresses and more frames are transmitted from the broadcast server. In an embodiment, Zi is updated as follows: $Z_i = Z_i - \{F_F\}$ where $F_j$ is the most recent frame transmitted by the server from group $Z_i$.

At step 708, a check is performed whether $|Z_i|$ is equal to zero after frequent updation. If $|Z_i|$ becomes zero then the steps 702-708 are repeated. If $|Z_i|$ does not become zero then the steps 704-708 are repeated.

At step 710, frame transmission sequence is generated and the generated sequence of frame is broadcasted.

At step 712, wireless client scans and receives the frame. At step 714, a check is performed whether the client have received all the frames. If all the frames have not been received then at step 716 parity code technique is employed to recover frames.

In an exemplary embodiment of the present invention, if set of frames are given as follows:
$Z_1 = \{F_1, F_2, F_3, F_4\}$
$Z_2 = \{F_5, F_6, F_7, F_8\}$
$Z_3 = \{F_9, F_{10}, F_{11}, F_{12}\}$
Then the sequence generated by the above method is as follows:
$F_1, F_5, F_9, F_2, F_6, F_{10}, F_3, F_7, F_{11}, F_4, F_8, F_{12}$
In an embodiment of the present invention, if there is a burst loss of two frames $F_5$ and $F_9$, lost frames can be recovered as losses correspond to single frame loss in group $Z_2$ and $Z_3$ for which parity code technique of FIG. 6 may be employed. Thus, by simply reordering the sequence in which frames are transmitted even burst losses can be recovered. In various embodiments of the present invention, where large numbers of groups are involved maximum benefit in terms of throughput and user experience can be derived.

The present invention may be implemented in numerous ways including as a system, a method, or a computer readable medium such as a computer readable storage medium or a computer network wherein programming instructions are communicated from a remote location.

The system, method and computer program product for improving bandwidth as described herein is particularly well suited for data loss recovery in broadcast systems, however, may be applied to various systems in other domains by performing minor modifications as would be apparent to a person of skill in the art.

While the exemplary embodiments of the present invention are described and illustrated herein, it will be appreciated that they are merely illustrative. It will be understood by those skilled in the art that various modifications in form and detail may be made therein without departing from or offending the spirit and scope of the invention.

What is claimed is:

1. A method for transferring data in a wireless local area network, the method comprising the steps of:
   splitting user data into one or more data fragments;
   creating one or more beacon frames by placing each data fragment in a unique beacon frame;
   arranging the one or more beacon frames into a plurality of groups;
   computing a parity code for each group in order to build a plurality of parity frames corresponding to the plurality of groups, wherein the parity frames enable reconstruction of beacon frames lost in a transmission sequence, based on content of the remaining beacon frames in the transmission sequence;
   sequentially transmitting from an access point of the wireless local area network, the one or more beacon frames interspersed with one or more parity frames of the plurality of parity frames;
   receiving the one or more beacon frames by a wireless client; and
   extracting each data fragment from each beacon frame.

2. The method of claim 1, further comprising reconstructing the user data from the extracted data fragments by the wireless client, wherein the user data is reconstructed by reassembling the data fragments.

3. The method of claim 1, wherein size of each data fragment is less than or equal to 26 bytes.

4. The method of claim 1, wherein the step of creating one or more beacon frames comprises the steps of:
   inserting each data fragment in SSID field structure of the beacon frame; and
   inserting header information in the SSID field structure.

5. The method of claim 1, wherein broadcasting the one or more beacon frames comprises the step of using a distinct BSSID for each individual frame.

6. The method of claim 5, wherein the one or more beacon frames containing the one or more data fragments are broadcasted in a singular channel.

7. The method of claim 1, wherein receiving the one or more beacon frames comprises the step of relaying each beacon frame by a NIC of the wireless client to a MAC layer for processing.

8. The method of claim 1, wherein computing a parity code for each group comprises the steps of:
   calculating each parity byte of the parity code by performing an exclusive OR operation of corresponding bytes of beacon frames in the group;
   computing a parity code for each group in order to build a plurality of parity frames; and
   transmitting the one or more beacon frames interspersed with the plurality of parity frames.

9. The method of claim 8, wherein transmitting the one or more beacon frames comprises the steps of:

positioning groups in the plurality of groups by arranging them in decreasing order of number of frames in each group; and transmitting beacon frames of each group in succession by selecting a group as per the positioning.

10. The method of claim 9, wherein receiving the one or more beacon frames comprises the steps of:

performing a check to determine whether the one or more beacon frames have been received; and executing an exclusive OR operation of frames belonging to the same group as a lost frame with a parity frame of the group in order to recover the lost frame.

11. A system for transferring data in a wireless local area network, the system comprising:

a broadcast server configured to broadcast user data through a wireless medium, wherein the broadcast server comprises:

a server application configured to:
fragment user data into one or more data fragments,
insert the one or more data fragments into one or more beacon frames,
arrange the one or more beacon frames into a plurality of groups,
compute a parity code for each group in order to build a plurality of parity frames corresponding to the plurality of groups,
wherein the parity frames enable reconstruction of beacon frames lost in a transmission sequence, based on content of the remaining beacon frames in the transmission sequence, sequentially transmit through the wireless medium, the one or more beacon frames interspersed with one or more parity frames from the plurality of parity frames; and a throughput scaling module configured to assign a distinct BSSID to each beacon frame for transmission; and a wireless client configured to receive data broadcasted by the broadcast server.

12. The system of claim 11, wherein the wireless client comprises:

a WLAN hardware interface configured to drive the one or more beacon frames to MAC layer for further processing;

a data reassemble module configured to extract the one or more data fragments from the one or more beacon frames, and to reassemble the user data from the one or more data fragments; and a client application for utilizing the user data to perform a software task.

\* \* \* \* \*

UNITED STATES PATENT AND TRADEMARK OFFICE
CERTIFICATE OF CORRECTION

| | | |
|---|---|---|
| PATENT NO. | : 8,189,618 B2 | Page 1 of 2 |
| APPLICATION NO. | : 12/386673 | |
| DATED | : May 29, 2012 | |
| INVENTOR(S) | : Karthikeyan Balaji Dhanapal, Kartik Muralidharan and Puneet Gupta | |

It is certified that error appears in the above-identified patent and that said Letters Patent is hereby corrected as shown below:

On the Title Page:

(75) Inventors: "Tamif Nadu" should read --Chennai--; "Karnataka" (first instance) should read --Bangalore-- and "Karnataka" (second instance) should read --Bangalore--

(57) Abstract, line 3 "is provided" should read --are provided--

In the Specification:

Column 1, line 7, "relates to system" should read --relates to a system--

Column 1, line 17, "With increase" should read --With an increase--

Column 1, line 40, "id" should read --ID--

Column 1, line 45-46, "connection oriented" should read --connection-oriented--

Column 2, line 7, "network is provided" should read --network are provided--

Column 2, line 27, "in SSID" should read --in the SSID--

Column 2, line 33, "by a NIC" should read --by an NIC--

Column 2, line 33, "to MAC" should read --to the MAC--

Column 2, line 40, "inserting" should read --insert--

Column 2, line 49, "frames to" should read --frames to the--

Column 3, line 15, "BSSID's" should read --BSSIDs--

Column 3, line 41, "is" should read --are--

Column 4, line 26, "LAN's" should read --LANs--

Column 4, line 30, "id" should read --ID--

Column 5, line 27, "a NIC" should read --an NIC--

Column 5, line 34, "device also" should read --device is also--

Column 5, line 57, line "with a" should read --with an--

Column 6, line 1, "element id" should read --element ID--

Signed and Sealed this
Twenty-sixth Day of November, 2013

Margaret A. Focarino
*Commissioner for Patents of the United States Patent and Trademark Office*

CERTIFICATE OF CORRECTION (continued)
U.S. Pat. No. 8,189,618 B2

Column 6, line 45, "fragment id" should read --fragment ID--

Column 6, line 46, "fragment id" should read --fragment ID--

Column 6, line 47, "fragment id" should read --fragment ID--

Column 6, line 57, "fragmented" should read --fragments--

Column 6, line 58, "in a SSID" should read --in an SSID--

Column 7, line 5, "BBSID's" should read --BBSIDs--

Column 7, line 16, "pushes" should read --push--

Column 7, line 19, "BBSID's" should read --BBSIDs--

Column 7, line 22, "BBSID's" should read --BBSIDs--

Column 7, line 43, "are" should read --is--

Column 7, line 65, "more number of beacon" should read --more beacon--

Column 8, line 7, "BBSID's" should read --BBSIDs--

Column 8, line 52, "are" should read --is--

Column 9, line 48, "client have" should read --client has--

Column 10, line 7, "is" should read --are--

Column 10, line 9, "may" should read --they may--

In the Claims:

Column 10, line 41, "wherein size" should read --wherein the size--

Column 10, line 56, "a NIC" should read --an NIC--

Column 12, line 16, "frames to MAC" should read --frames to a MAC--